United States Patent
Hiroki

(10) Patent No.: US 6,331,095 B1
(45) Date of Patent: *Dec. 18, 2001

(54) TRANSPORTATION SYSTEM AND PROCESSING APPARATUS EMPLOYING THE TRANSPORTATION SYSTEM

(75) Inventor: Tsutomu Hiroki, Yamanashi-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/285,103

(22) Filed: Apr. 2, 1999

(30) Foreign Application Priority Data

Apr. 4, 1998 (JP) .................................................. 10-108577

(51) Int. Cl.7 ...................................................... B65H 1/14
(52) U.S. Cl. .................... 414/222.01; 414/609; 414/935; 414/936; 414/940
(58) Field of Search ...................................... 414/217, 222, 414/609, 757, 786, 935, 936, 940

(56) References Cited

U.S. PATENT DOCUMENTS

| | | | |
|---|---|---|---|
| 4,816,098 | * 3/1989 | Davis et al. ......................... | 156/345 |
| 5,823,736 | * 10/1998 | Matsumura ........................... | 414/609 |
| 5,879,128 | * 3/1999 | Tietz et al. ............................ | 414/757 |
| 5,879,460 | * 3/1999 | Begin et al. .......................... | 118/719 |
| 5,883,017 | * 3/1999 | Tepman et al. ....................... | 438/800 |
| 5,934,856 | * 8/1999 | Asakawa et al. ..................... | 414/217 |
| 5,989,346 | 11/1999 | Hiroki . | |

* cited by examiner

Primary Examiner—Joseph A. Fischetti
(74) Attorney, Agent, or Firm—Smith, Gambrell & Russell, LLP

(57) ABSTRACT

Two pairs of lifters 9A and two pairs of lifters 9B are arranged on a table 7 in a processing chamber 2. In a transporting chamber 3 communicating with the processing chamber 2, a transporting mechanism 10 of an articulated robot is provided with a catch plate 10E in a single stage arrangement. The elevation of a rotating spindle 10A of the transporting mechanism 10 allows the catch plate 10E to be moved up and down. By rising and falling the catch plate 10E while stopping the lifters 9A, 9B, it is possible to transfer a substrate between the catch plate 10E and the lifters 9A or between the catch plate 10E and the lifters 9B.

6 Claims, 5 Drawing Sheets

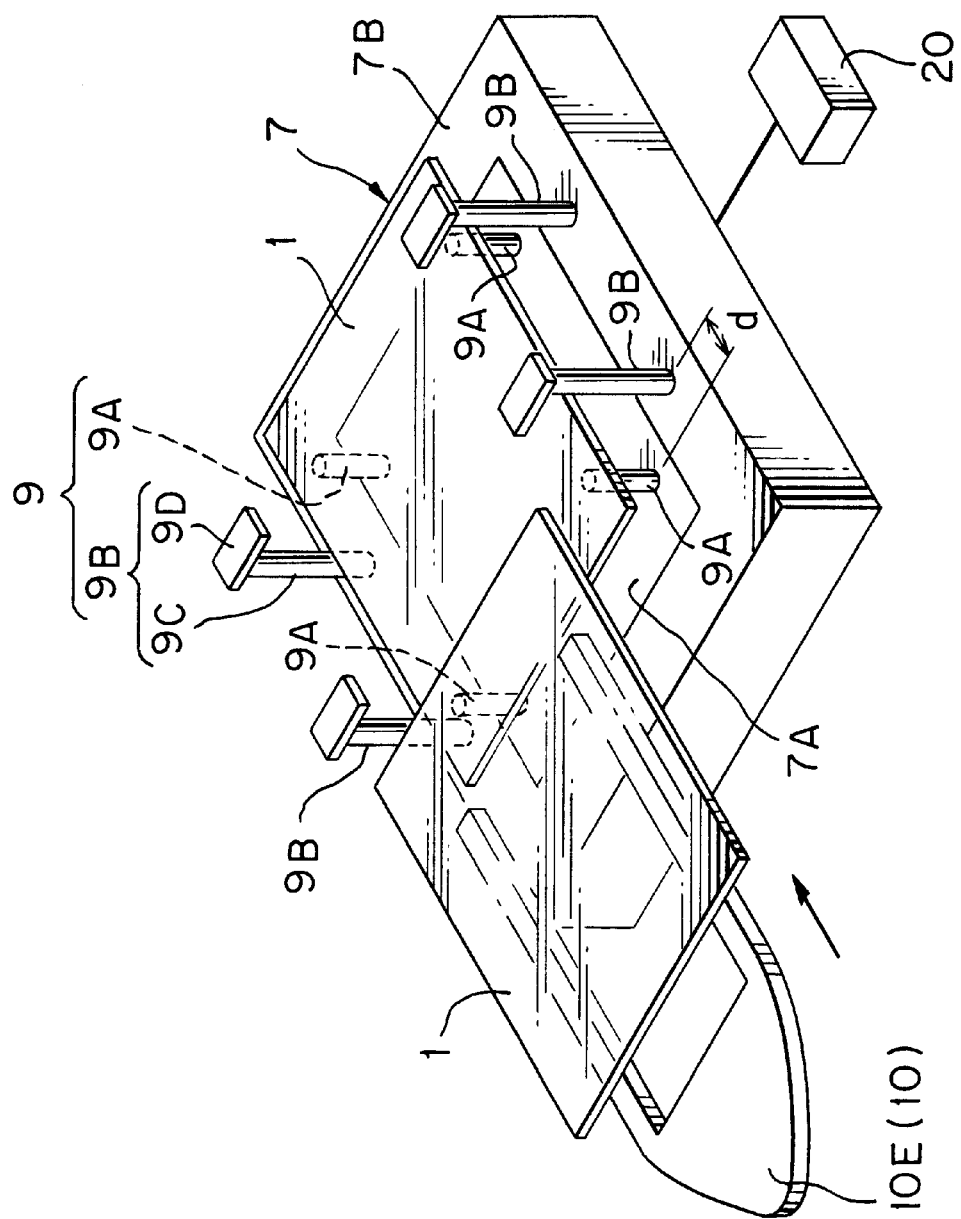
F I G. 2

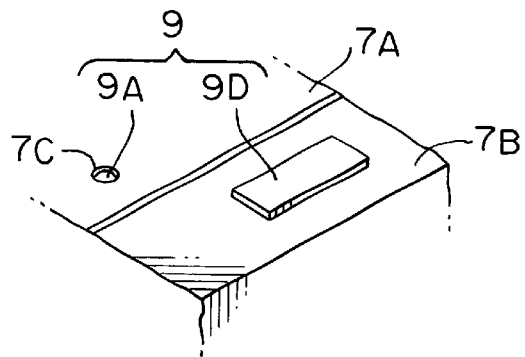
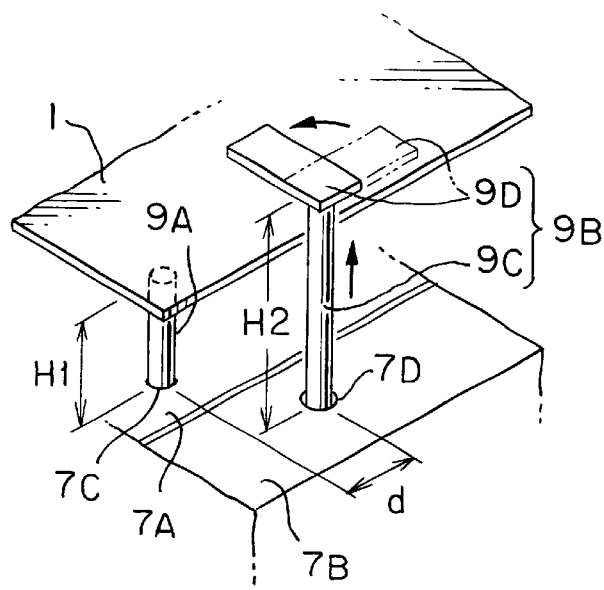
FIG. 3(a)
FIG. 3(b)
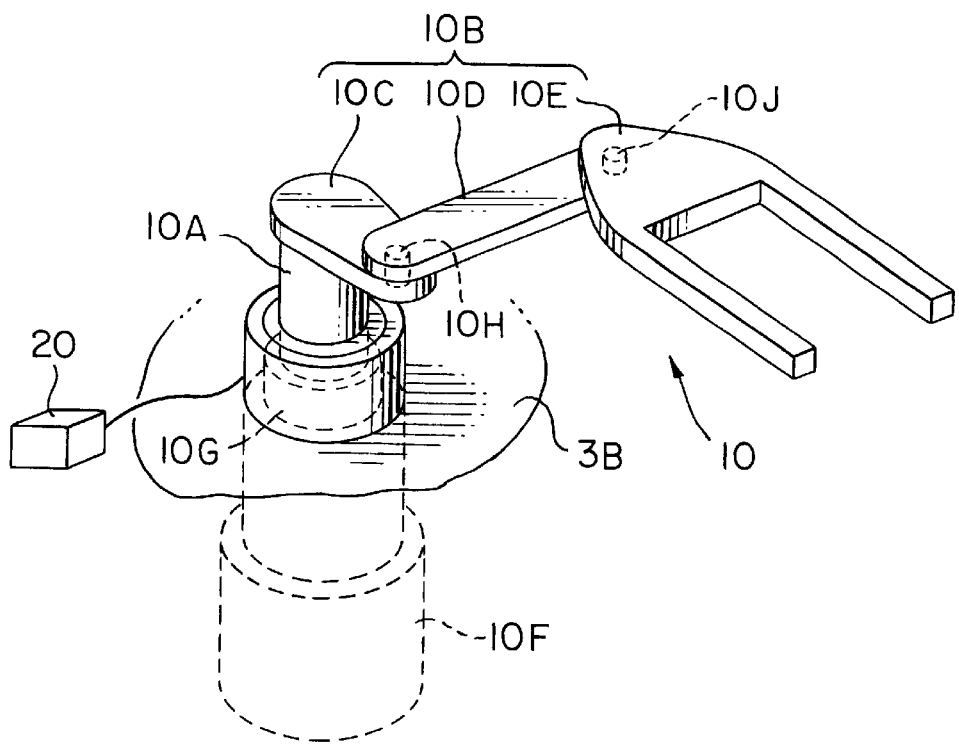
FIG. 4

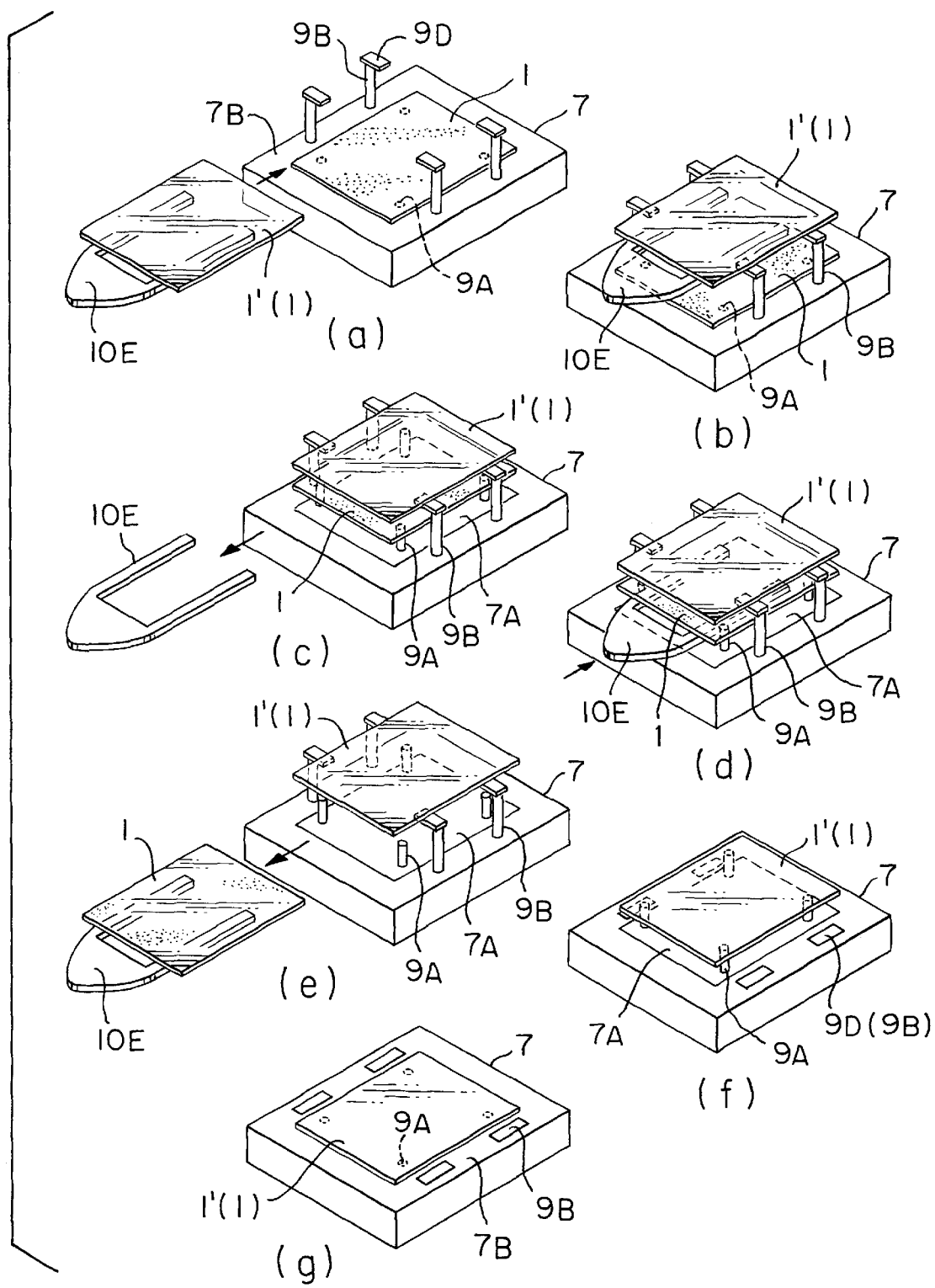
F I G. 5

TRANSPORTATION SYSTEM AND PROCESSING APPARATUS EMPLOYING THE TRANSPORTATION SYSTEM

BACKGROUND OF THE INVENTION

1. Technical Field of the Invention

The present invention relates to a transportation system for transporting objects before and after processing, for example, substrates for liquid crystal display (referred as "LCD substrates" hereinafter), semiconductor wafers, or the like, and also relates to a processing apparatus equipped with the transportation system for transporting the objects.

2. Description of the Related Art

As the processing apparatus of this kind, there has been widely employed a multi-chamber type of processing apparatus. The multi-chamber processing apparatus includes a plurality of processing chambers (e.g. three chambers) for applying identical or different kinds of treatments on the objects under atmosphere of reduced pressure, a transporting chamber having a function as a second load-lock chamber connected with the processing chambers, a load-lock chamber connected with the transporting chamber as well as the processing chambers and a mechanism for delivering the LCD substrates from a carrier mounted on a mounting mechanism to the load-lock chamber and vice versa.

In operation of the above apparatus, the substrate is brought into the load-lock chamber by the carrier. The substrate loaded in the load-lock chamber is transported from the load-lock chamber into a designated processing chamber by a transporting mechanism arranged in the transporting chamber. In the processing chamber, the substrate is subjected to a film deposition process by the plasma CVD method. Thereafter, the substrate upon completion of the film deposition process is accommodated in the carrier mounted on a second mounting mechanism, in the opposite course to the above course.

As the transporting mechanism, there has been employed an articulated robot which is provided, at a tip thereof, with a catch plate for mounting the substrate thereon. Recently, for the purpose of increasing the throughput, there is used a transporting mechanism having an upper catch plate and a lower catch plate in the "two-stage" arrangement. In the mechanism, one catch plate is used in order to load the substrate into the processing chamber, while the other catch plate is used to unload the substrate from the processing chamber. Two groups of substrate lifters (substrate supporting members) are arranged on a mounting table in the processing chamber. Each group of substrate lifters is adapted so as to move up and down in accordance with the designated steps.

Thus, in the processing chamber, the catch plates do not perform vertical movement in the processing chamber, and the lifters move up and down in accordance with predetermined steps so as to carry out the delivery of the substrates between the lifters and the catch plates. In this way, the operative cooperation of the catch plates in the two-stage arrangement with two groups of substrate lifters allows the loading/unloading of the substrates and the mounting/withdrawal on and from the mounting table to be performed effectively.

In the above-mentioned system, however, the control to drive the substrate lifters is apt to be complicated. Additionally, due to the complicated motion of the substrate lifters, there is an increased possibility that particles are produced in the processing chamber disadvantageously.

SUMMARY OF THE INVENTION

Accordingly, it is therefore an object of the present invention to solve the problems in the above-mentioned prior art. In detail, the object of the invention is to provide a transporting system which is capable of reducing the possibility of producing the particles in the processing chamber, shortening the time required for transporting the substrates, from what would be typical in such a mechanism using the two-stage type of catch plates, and improving the reliability of the transporting system. Furthermore, it is another object of the invention to provide a processing apparatus of high performance employing the above transporting system of the invention.

According to the first aspect of the invention, the objects of the present invention described above can be accomplished by a method of placing an object before being processed on a table and removing an object after being processed from the table, the method including the steps of: (a) causing the object after being processed on the table to be rested on the first lifters, and lifting up the object after being processed on the table to a first height by first lifters; (b) moving a transporting member to a position above the mounting table and lower than the first height; (c) raising the transporting member to a position higher than the first height, so that the object after being processed rested on the first lifters rests on the transporting member and that the object after being processed is left from the first lifters; (d) withdrawing the transporting member carrying the object after being processed from upward of the mounting table; (e) raising second lifters to a second height different from the first height; (f) moving the transporting member, on which the object before being processed rests, to a position above the table and higher than the second height; (g) lowering the transporting member carrying the object before being processed, to a position lower than the second height, so that the object before being processed carried by the transporting member rests on the second lifters and that the object to be processed is left from the transporting member; (h) withdrawing the transporting member, which the object before being processed has been left therefrom, from the table; and (i) lowering the second lifters carrying the object before being processed so that the object before being processed rests on the table.

According to the second aspect of the invention, there is also provided a transporting system for transporting an object before being processed to a table and for transporting an object after being processed on the table to another position, said transporting system including: a transporting member provided with a supporting surface for supporting the object; a horizontal driving mechanism for moving the transporting member from a position above the table to the other position; first lifters provided with respective supporting surfaces allowing the object to be supported thereon, the first lifters being capable of moving vertically and being capable of carrying the object at a first height above the table; second lifters provided with respective supporting surfaces allowing the object to be supported thereon, the first lifters being capable of moving vertically and being capable of carrying the object at a second height above the table; and a vertical driving mechanism capable of elevating the transporting member between a low position lower than the first height and a high position higher than the first height above the mounting table and also capable of elevating the transporting member between a low position lower than the second height and a high position higher than the second height above the table.

In this case, it is preferable that the transporting system further includes a sequence controller for controlling respective motions of the first lifters, the second lifters and the vertical driving mechanism. Preferably, in case of transferring the object between the transporting member and the first lifters, the sequence controller has a function to control the motions of the first lifters and the vertical driving mechanism so that, upon resting the supporting surface of the first lifters at the first height, the supporting surface of the transporting member can be moved between the low position lower than the first height and the high position higher than the first height. Preferably, in the case of transferring the object between the transporting member and the second lifters, the sequence controller has another function, to control the motions of the second lifters and the vertical driving mechanism, so that, upon resting the supporting surface of the second lifters at the second height, the supporting surface of the transporting member can be moved between the low position lower than the second height and the high position higher than the second height.

According to the third aspect of the invention, there is also provided a processing apparatus for processing an object to be processed, the processing apparatus including:

a processing chamber in which a table for placing the object thereon is arranged and which applies a designated treatment on the object under a decompressed atmosphere;

a transporting chamber communication with the processing chamber;

closing gate means for insulating an atmosphere of the processing chamber from an atmosphere of the transporting chamber, the closing gate means being capable of opening;

a lifting mechanism for elevating the object provided in the processing chamber, the lifting mechanism including:

first lifters provided with respective placing surfaces allowing the object to be placed thereon, the first lifters being capable of moving vertically and supporting the object at a first height above the table; and second lifters provided with respective placing surfaces allowing the object to be placed thereon, the first lifters being capable of moving vertically;

and a transporting mechanism provided in the transporting chamber, the transporting mechanism including:

a transporting member provided with a supporting surface for supporting the object;

a horizontal driving mechanism for moving the transporting member from one position above the mounting table to another position in the transporting chamber; and a vertical driving mechanism capable of elevating the transporting member between a low position lower than the first height and a high position higher than the first height above the table and also capable of elevating the transporting member between a low position lower than the second height and a high position higher than the second height above the table.

The above and other features and advantages of this invention will become apparent, and the invention itself will best be understood, from a study of the following description and appended claims, with reference to the attached drawings showing a preferred embodiment of the invention.

BRIEF DESCRIPTION OF THE DRAWINGS

FIG. 2 is a perspective view showing a table in a processing chamber and a delivery mechanism attached to the table of the processing apparatus of FIG. 1;

FIG. 3 shows perspective views for explanation of the operation of the delivery mechanism of FIG. 2;

FIG. 4 is a perspective view showing a transporting mechanism arranged in a transporting chamber of the processing apparatus of FIG. 1;

FIG. 5 shows perspective views showing an example of steps to remove a processed substrate from the table and to place a substrate to be processed on the table.

DESCRIPTION OF THE PREFERRED EMBODIMENT

Based on an embodiment shown in FIGS. 1 to 6, the present invention will be described hereinafter, in detail.

First, we now describe the whole constitution of the processing apparatus. Note that the embodiment will be described on assumption that the processing apparatus is capable of forming a film on an LCD substrate as the object by means of plasma CVD method.

Figure 1:
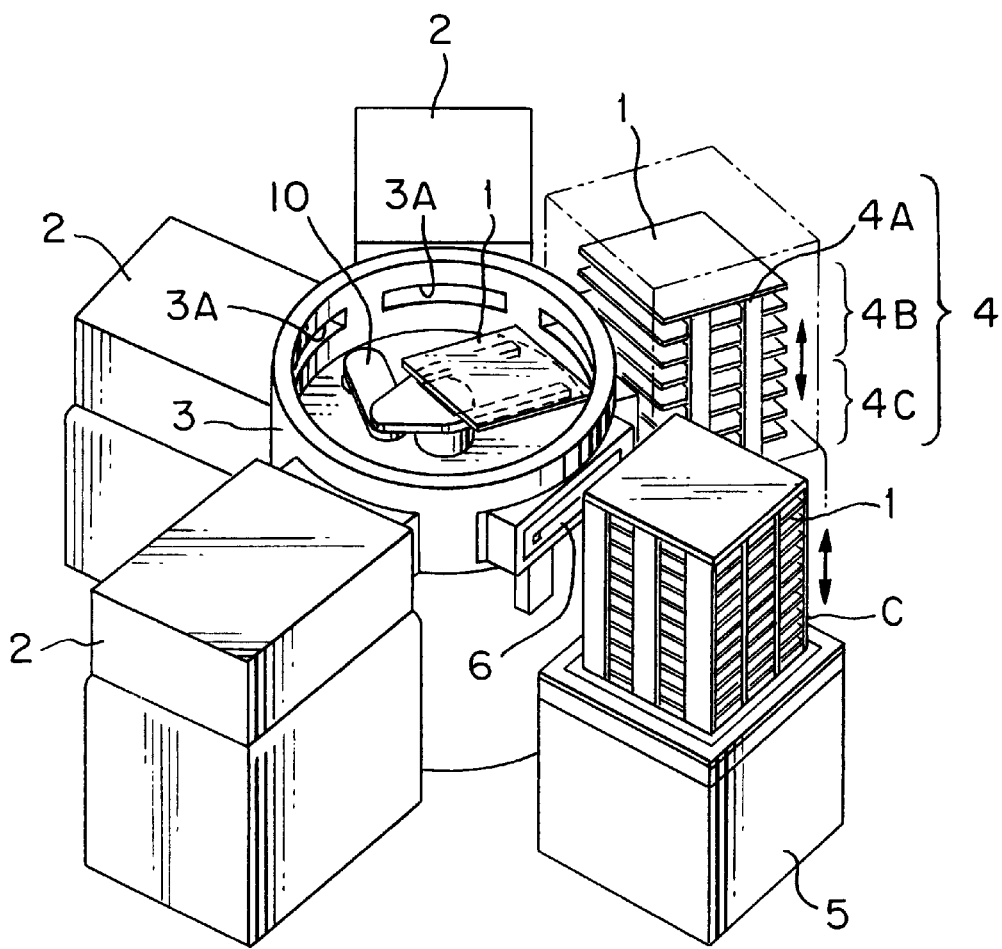
FIG. 1 is a perspective view of a processing apparatus in accordance with an embodiment of the present invention.

As shown in FIG. 1, the processing apparatus includes a substantially columnar transporting chamber 3, three chambers 2 arranged around the transporting processing chamber 3, a buffer chamber 4 and a mounting mechanism 5 for a carrier C. The processing chambers 2 are chambers for applying the CVD treatment on the substrates to be processed by using plasma under atmosphere of reduced pressure. In the embodiment, the transporting chamber 3 has also a function as a load-lock chamber. It is noted that, in FIG. 1, a top plate of the transporting chamber 3 is eliminated for facilitating the understanding of the drawing.

A cylindrical housing defining the transporting chamber 3 is provided with a plurality of openings 3A. One of the openings 3A is opposed to the carrier C. The remaining openings 3A are respectively opposed to the respective processing chambers 2 and the buffer chamber 4 to communicate them with the transporting chamber 3. To the respective openings 3A, gate valves 6 are attached for cutting off the atmosphere in the transporting chamber 3 from the atmosphere outside the chamber 3. The opening of the gate valves 6 allows the substrate 1 to be loaded into and unloaded from the transporting chamber 3 through the openings 3A.

As shown in FIG. 2, in each processing chamber 2, a table 7 is provided for placing the substrate 1 thereon. The table 7 has a lower electrode 7A embedded therein. In the chamber 2, a top surface of the lower electrode 7A constitutes the table's placing surface for placing the substrate 1. Above the lower electrode 7A, an upper electrode (not shown) is disposed in parallel with the lower electrode 7A. Connected with the lower electrode 7A through a matching circuit (not shown) is a high-frequency power source (also not shown) which supplies the high-frequency power to the lower electrode 7A. The not-shown upper electrode also serves as a supplier of process gas, which supplies the process gas to the whole surface of the substrate 1 on the lower electrode 7A. The process gas is subjected to the plasma process by applying the high-frequency power on the lower electrode 7A while maintaining the processing chambers 2 of a predetermined degree of vacuum. By using the resultant plasma, it is possible to form an insulating film, a wiring membrane, etc. on the surface of the substrate 1 mounted on the lower electrode 7A, by the CVD processing. Note that reference numeral 7B designates a shield member surrounding the lower electrode 7A.

Next, we describe the transporting system for loading/unloading the substrate 1 with respect to each chamber 2 and for placing/removing the substrates 1 with respect to the mounting table 7. The transporting system includes a lifting mechanism i.e. a delivery mechanism 9 assembled in the mounting table 7; and a transporting mechanism 10 in the transporting chamber 3.

As shown in FIG. 2 and FIGS. 3A and 3B, the delivery mechanism 9 comprises two sets of substrate supporting members, i.e. substrate lifters 9A and 9B.

The inside lifters 9A are provided in holes 7C formed in four positions on both sides of the lower electrode 7A. Each inside lifter 9A in the form of a pin is adapted so as to rise and fall by elevating means, such as a pneumatic cylinder, installed in the mounting table 7. The top of the inside lifter 9A, that is, the substrate supporting surface of the lifter 9A, can be elevated to a height Hi. When lowering the inside lifter 9A, it is then accommodated in the hole 7C, so that it is possible to position the top of the lifter 9A beneath the surface of the lower electrode 7A.

The outside lifters 9B are disposed on the shield member 7B about the lower electrode 7A. Each of the outside lifters 9B includes a reversible pin 9C and a rectangular plate 9D attached on the top of the pin 9C. The pins 9C of the respective lifters 9B are accommodated in a plurality of holes 7D in the shield member 7B, which are formed adjacent to the holes 7C, respectively. Note, in order to prevent the inside lifter 9A and the adjoining outside lifter 9B from interfering with each other, each hole 7D is positioned and deviated from the adjoining hole 7C by a distance (d) in the direction of arrow in FIG. 2. In the table 7, there are provided rotating means (not shown), such as a motor, for rotating the pins 9C and elevating means (also not shown) for raising and lowering the pins 9C. Each of the plates 9D of the outside lifters 9B is capable of rising up to a height H2 higher than the above height. The rotation of the pin 9C allows the plate 9D to displace between a position where the whole plate 9D is apart from the lower electrode 7A (see FIG. 3A) and another position where a tip portion of the plate 9D projects above the lower electrode (see FIG. 3B).

Next, the transporting mechanism will be explained. As shown in FIGS. 1 and 4, the transporting mechanism is includes an articulated robot arm. The transporting mechanism 10 includes a rotating spindle 10A arranged on a base 3B at the center of the transporting chamber 3 and an arm part 10B linked to the spindle 10A. The spindle 10A can be rotated by driving a servo-motor 10G.

The arm part 10B comprises a first arm 10C, a second arm 10D and a catch plate 10E in the form of a fork (i.e., a transporting member). The catch plate 10E has a pair of substrate-carrying faces in the same level.

The first arm 10C has a base part securely connected with a top end of the spindle 10A. The second arm 10D has a base part rotatably connected with a leading part of the first arm 10C through a servo-motor 10H. The catch plate 10E has a base part rotatably connected with a leading part of the second arm 10D through a servo-motor 10J. Thus, the mutual combination of respective motions of the spindle 10A and the servo-motors 10H, 10J allows the catch plate 10E to be moved on the horizontal plane freely. The rotating spindle 10A can be moved up and down by a pneumatic cylinder 10F, i.e., an elevator mechanism schematically shown in FIG. 4. The driving of the pneumatic cylinder 10F also allows the catch plate 10E to rise and fall in the vertical direction.

Referring to FIG. 1 again, an elevating buffer rack 4A is arranged in the buffer chamber 4, for retaining the plural substrates 1. The buffer rack 4A is provided with a heating area 4B and a cooling area 4C. In the heating area 4B and the cooling area 4C, appropriate heating and cooling means are respectively arranged so as to surround the buffer rack 4A. When loading/unloading the substrate 1 through the transporting mechanism 10, heating the substrate 1 (before processing) in the heating area 4B for the preceding treatment, or when cleaning the processed substrate 1 in the cooling area 4C, the buffer rack 4A moves up and down.

The mounting mechanism 5 is equipped with a not-shown elevating mechanism to move the carrier C up and down when delivering the substrate 1 between the transporting chamber 3 and the carrier C through the transporting mechanism 10.

Next, we describe the steps of executing the CVD process with reference to FIGS. 1 and 5. Note that the operations and operational timing of the catch plate 10E, the lifter 9A and the lifter 9B are controlled by a sequence controller 20 controlling the whole operation of the processing apparatus.

Firstly, it is executed to close the gate valves 6 in order to reduce the pressure of the respective processing chambers 2 for the appointed vacuum. Next, the other gate valves corresponding to the carriers C and the buffer chambers 4 are opened. Then, by the transporting mechanism 10, the substrates 1 in the carrier C are taken out one by one to load it into the buffer chamber 4.

After loading the designated pieces of substrates 1 into the buffer chamber 4, the gate valve 6 corresponding to the carrier C is closed. Next, the transporting chamber 3 and the buffer chamber 4 are evacuated to the decompressed state corresponding to processing chamber 2 and thereafter, the gate valve 6 corresponding to the buffer chamber 4 is closed.

In this state, the buffer rack 4A in the buffer chamber 4 rises and falls, so that the substrates 1 are heated in the heating area 4B in the pre-treatment to remove such impurities as moisture or the like, sticking to the surfaces of the substrates 1. Next, it is executed to open the gate valve 6 corresponding to one processing chamber 2 and one buffer chamber 4.

Then, the buffer rack 4A rises and falls in the buffer chamber 4 so that the substrate 1 to be taken out at first is level with the catch plate 10E waiting in front of the opening 3A corresponding to the buffer chamber 4. In this situation, the arm part 10B is so expanded that the catch plate 10E is inserted into the buffer rack 4A on the downside of the substrate 1. Continuously, the catch plate 10E is slightly raised to lift up and carry the substrate 1. Next, the arm part 10B is bent to unload the substrate 1 from the buffer chamber 4 into the transporting chamber 3.

Sequentially, the arm part 10B rotates such that the catch plate 10E, on which the substrate 1 rests, opposes to the opening 4A corresponding to the designated processing chamber 2.

On the other hand, in the processing chamber 2, the inside lifters 9A and the outside lifters 9B are raised into a height H1 and a height H2, respectively.

The arm part 10B is elevated so that the substrate 1 resting on the catch plate 10E is somewhat higher than the above height H2. Next, the arm part 10B is elongated to load the LCD substrate 1 into the processing chamber 2. Then, the substrate 1 is positioned right above the lower electrode 7A in the table 7, by the catch plate 10E. Next, the catch plate 10E is lowered to put the substrate 1 on the plates 9D of the outside lifters 9B. Thereafter, the arm part 10B is withdrawn from the processing chamber 2. Next, the outside lifters 9B are lowered to deliver the substrate 1 onto the inside lifters 9A. Then, the inside lifters 9A are accommodated in the lower electrode 7A, so that the substrate 1 rests on the table 7. Note, the above operation will be described in detail, with reference to the views (e), (f) and (g) of FIG. 5, later.

When the substrate 1 is placed on the table 7 and the arm part 10B is withdrawn from the processing chamber 2, it is executed to close the gate valve 6 corresponding to the processing chamber 2. Thus, the CVD treatment is applied on the substrate 1 in the processing chamber 2.

On completion of the CVD treatment, by the arm part 10B, a substrate 1 to be treated is unloaded from the buffer chamber 4 and successively transported to a position opposing against the opening 4A corresponding to the processing chamber 2. Simultaneously to the motion, the gate valve 6 in the processing chamber 2 is opened.

With reference to FIG. 5, we now describe the operation to replace the processed substrate on the table 7 in the processing chamber 2 with the substrate before processing. In order to facilitate the understanding of the drawing, reference numeral 1 designates the substrate after being processed, while 1' designates the substrate before being processed.

Just after the CVD treatment has been completed, the processed substrate 1 rests on the lower electrode 7A of the table 7. Then, the outside lifters 9B are on the accommodated condition, as shown in the view (g) of FIG. 5. From the situation, first, the outside lifters 9B are raised so that the plates 9D thereon are level with the height H2 and thereafter, they are stopped. During the raising of the lifters 9B, the plates 9D are rotated by an angle of 90 degrees. When viewing the plates 9D from the right overhead, the leading ends of the plates 9D overlap with the lower electrode 7A, while, the catch plate 10E opposing the opening 4A corresponding to the processing chamber 2 carries the substrate 1' before being processed in a position somewhat higher than the height H2 of the plates 9D of the outside lifters 9B. The above-mentioned steps are shown in the view (a) of FIG. 5.

Next, the catch plate 10E supporting the substrate 1' to be processed horizontally moves with no change in height and occupies right above the processed substrate 1. Thereafter, the catch plate 10E is lowered vertically so that the supporting surface is somewhat lower than the height H2. By way of lowering the catch plate 10E, the substrate 1' before being processed comes into contact with the plates 9D of the outside lifters 9B. When dropping the catch plate 10E furthermore, the substrate 1' is left from the catch plate 10E and finally rest on the plates 9D. The above-mentioned steps are shown in view (b) of FIG. 5.

In the above-mentioned process, it may be executed, upon previously positioning the catch plate 10E supporting the substrate 1' above the lower electrode 7A, to elevate the outside lifters 9A and thereafter, lower the catch plate 10E, so that the substrate 1' is delivered from the catch plate 10E to the outside lifters 9B.

Next, the vacant catch plate 10E retreats from the upward area of the lower electrode 7A while keeping its height. Then, the inside lifters 9A are raised to lift up the processed substrate 1 to the height H1. The same lifters 9A are stopped at that position. The above-mentioned steps are shown in the view (c) of FIG. 5.

Next, the vacant catch plate 10E is lowered so that the supporting surface is somewhat lower than the height H1. Next, the catch plate 10E horizontally moves with no change in height and enters into the downside of the processed substrate 1. Thereafter, the catch plate 10E is elevated vertically so that the supporting surface is somewhat higher than the height H2. By way of raising the catch plate 10E, the substrate 1' before being processed comes into contact with the catch plate 10E. When raising the catch plate 10E furthermore, the processed substrate 1 is apart from the inside lifters 9A and finally supported by the catch plate 10E. The above-mentioned steps are shown in view (d) of FIG. 5.

The catch plate 10E supporting the processed substrate 1 moves horizontally and retreats from the upward area of the lower electrode 7A. The catch plate 10E continuously retreats to transport the processed substrate 1 into the transporting chamber 3. The above-mentioned steps are included in the view (e) of FIG. 5.

Next, the outside lifters 9B supporting the substrate 1' falls down so that the plates 9D are substantially as high as the top surface of the shield member 7B. In the process of lowering the outside lifters 9B, the substrate 1' to be processed comes into contact with the top faces of the inside lifters 9A. The further descent of the outside lifters 9B allows the substrate 1' to be left from the outside lifters 9B and supported by the inside lifters 9A finally. After the substrate 1' are left from the plates 9D of the outside lifters 9B, the plates 9D are lowered while conversely rotating by an angle of 90 degrees. As a result of the lowering operation, the plates 9D are wholly positioned on the shield member 7B without interfering with the lower electrode 7A. The inside lifters 9A supporting the substrate 1' begin to sink abreast with the movement of the outside lifters 9B after the plates 9D have been apart from the substrate 1'. The above-mentioned steps are included in view (f) of FIG. 5.

Thereafter, the inside lifters 9A are continuously lowered to be lost in the holes 7C in the lower electrode 7A. Thus, the LCD substrate 1 is placed on the lower electrode 7A. The above-mentioned step is shown in view (g) of FIG. 5.

In this way, the exchanging of the substrates and the accompanying loading/unloading in accordance with the above-mentioned steps allow time required for exchanging the substrates before and after the CVD treatment to be shortened and therefore, it is possible to replace the substrate 1 in a short time equal to that of the known transporting apparatus equipped with the two-stage catch plates. Additionally, since the motions of the lifters are simplified in comparison with those of the known transporting apparatus equipped with the two-stage catch plates, it is possible to reduce the possibility of the occurrence of particles in the processing chamber, whereby the possibility of the substrates being contaminated can be reduced.

When the exchange and transportation of the substrates are completed, then the processing chamber 2 is closed up to carry out the CVD treatment for the substrate 1 in the chamber 2.

Meanwhile, the processed substrate 1 discharged from the processing chamber 2 into the transporting chamber 3 is transported to the original position on the buffer rack 4A in the buffer chamber 4. The processed substrate 1 is cooled down in the cooling area 4C in the buffer chamber 4, making provision for the transfer from the buffer chamber 4 to the carrier C at any time.

After completing the process of all of the substrates 1 in the buffer chamber 4, they are transported from the buffer chamber 4 to the carrier C one by one while following the opposite course to the loading.

Next, referring to various views in FIG. 6, another method of exchanging and loading/unloading the substrate will be explained below.

Figure 6:
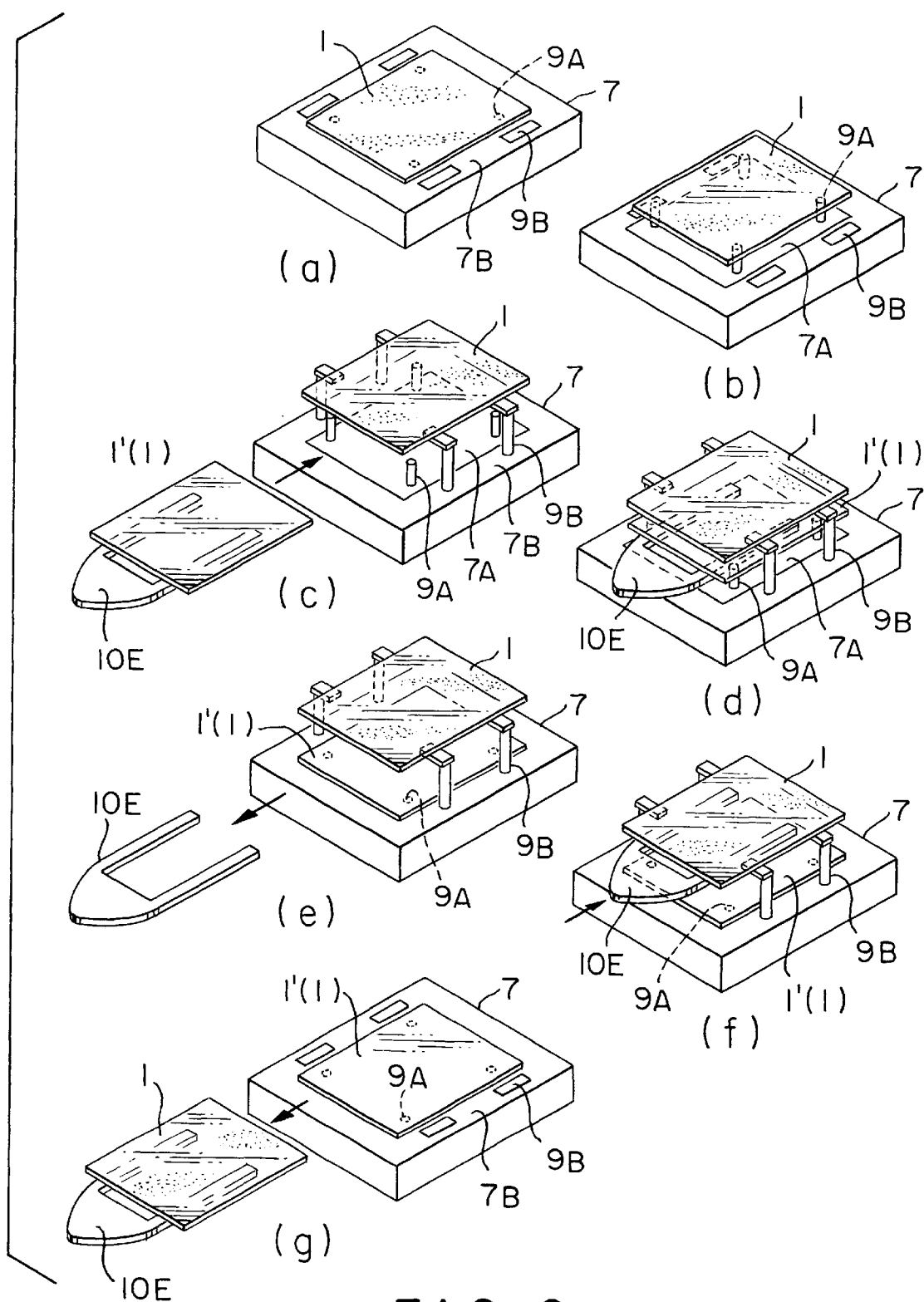
FIG. 6 shows perspective views showing another example of steps to remove a processed substrate from the table and place a substrate to be processed on the table.

When the processing of the substrate is completed as shown in view (a) of FIG. 6, the inside lifters 9A are elevated to lift up the processed substrate 1 as shown in view (b) of FIG. 6. Next, as shown in the view (c) of FIG. 6, the outside lifters 9B are raised to receive the processed substrate 1 from the inside lifters 9A.

Next, the catch plate 10E carrying the substrate 1' before being processed thereon enters into the processing chamber 2 in order to load the substrate 1' into the processing chamber 2. Continuously, under the processed substrate 1 supported by the outside lifters 9B, the catch plate 10E delivers the substrate 1' to the inside lifters 9A projecting from the lower electrode 7A as shown in view (d) of FIG. 6.

Next, as shown in view (e) of FIG. 6, the catch plate 10E is withdrawn from upward of the table 7. Then, the inside lifters 9A are lowered and therefore, the substrate 1' is brought on the table 7. Sequentially, the catch plate 10E is advanced to enter downward of the processed substrate 1, as shown in view (f) of FIG. 6. Next, the catch plate 10E is raised to accept the processed substrate 1 from the outside lifters 9B. Then, as shown in the view (g) of FIG. 6, the catch plate 10E is withdrawn from upward of the table 7, so that the processed substrate 1 is transported from the processing chamber 2 into the transporting chamber 3.

Also, in the case of dealing with the substrates 1, 1' in accordance with the successive steps shown in FIG. 6, there can be expected operations and effects which are similar to those in accordance with the steps of FIG. 5. Besides, it should be noted that, in the steps of FIG. 6, the substrate before being processed may be subject to contamination of the particles due to the arrangement where the substrate before being processed is loaded into the downward of the processed substrate. From this point of view, it is preferable to employ the steps shown in FIG. 5.

Hitherto, although the embodiment of the invention has been described by example of the plasma coating apparatus for LCD substrates as the processing apparatus, the applications of the invention are not limited to this embodiment. That is, the present invention is also applicable to other processing apparatuses, such as an etching apparatus. Further, the invention can be applied to various sorts of processing apparatuses.

What is claimed is:

1. A processing apparatus for processing a substrate, comprising:

a processing chamber for processing the substrate;

a table arranged in the processing chamber provided with an electrode which allows the substrate to be placed thereon;

a transporting chamber in communication with the processing chamber;

closing means for separating the atmosphere of the processing chamber from an atmosphere of the transporting chamber;

a lifting mechanism for lifting the substrate in the processing chamber, the lifting mechanism including:
first lifters arranged on the table and provided with placing surfaces for placing the substrate thereon, the first lifters being movable in a vertical direction to a first height, and
second lifters arranged on the table outside the first lifters and provided with placing surfaces for placing the substrate thereon, the second lifters being movable in a vertical direction to a second height, and comprising:
a supporting pin rotatable about a longitudinal axis thereof, and
a supporting plate fixed to an end of the pin, the supporting plate comprising the placing surface for the substrate, wherein a rotation of the pin causes a part of the supporting plate to extend over the electrode; and a transporting mechanism provided in the transporting chamber, which includes:
a transporting member provided with at least one support surface for supporting the substrate, the supporting surface being arranged on a single horizontal plane, and
a horizontal driving mechanism for moving the transporting member between a position above the table and a position in the transporting chamber.

2. The processing apparatus according to claim 1, wherein the transporting mechanism further comprises a vertical driving mechanism for elevating the transporting member between a first low position lower than the first height and a first high position higher than the first height above the table, and for elevating the transporting member between a second low position lower than the second height and a second high position higher than the second height above the table.

3. The processing apparatus according to claim 2, further comprising a sequence controller for controlling motions of the first lifters, the second lifters and the vertical driving mechanism in accordance with predetermined steps, wherein when the substrate is transferred between the transporting member and the first lifters, the supporting surface of the transporting member moves between the first low position lower than the first height and the first high position higher than the first height, and the placing surfaces of the first lifters stop at the first height; and when the substrate is transferred between the transporting member and the second lifters, the supporting surface of the transporting member moves between the second low position lower than the second height and the second high position higher than the second height, and the placing surfaces of the second lifters stop at the second height.

4. The processing apparatus according to claim 1, wherein:

each of the first lifters comprises a rod-shaped supporting member arranged around the electrode area of the table, the electrode area of the table accommodating the first lifters therein so that the placing surfaces of the first lifters can be positioned at a height lower than a surface of the electrode; and each of the second lifters is arranged around the electrode area of the table outside the first lifters, the second lifters comprising a supporting pin which is accommodated in the table and a supporting plate comprising the placing surface, the supporting plate being fixed on an end of the supporting pin, the supporting pin being rotatable about a longitudinal axis thereof, a rotation of the supporting pin allowing the supporting plate to occupy either a position where the supporting plate extends over the electrode area of the table or a position where the supporting plate does not extend over the electrode area of the table.

5. The processing apparatus according to claim 1, wherein the second height is higher than the first height.

6. A method of using the processing apparatus according to claim 1, comprising the steps of:

(a) raising the second lifters up to a height, and moving the transport member and an unprocessed substrate resting thereon to a first position above the table and higher than the height of the second lifters;

(b) causing a relative vertical movement between the second lifter and the transport member, so that the unprocessed substrate resting on the transport member rests on the second lifters;

(c) withdrawing the transport member from above the table;

(d) raising the first lifters, so that a processed substrate resting on the table moves up to a height, (e) moving the transport member to a second position above the table, the second position being lower than the processed substrate resting on the first lifters;

(f) causing a relative vertical movement between the first lifter and the transport member so that the processed substrate resting on the first lifters rests on the transport member;

(g) withdrawing the transport member from above the table;

(h) causing a relative movement between the first lifters and the second lifters so that the unprocessed substrate rests on the first lifters;

(i) lowering the first lifters and the unprocessed substrate resting thereon, so that the unprocessed substrate rests on the table, wherein the steps (a) to (i) are executed in the following order: step (a), (b), (c), (d), (e), (f), (g), (h) and (i).

* * * * *